(12) United States Patent
Kida et al.

(10) Patent No.: US 6,511,763 B1
(45) Date of Patent: Jan. 28, 2003

(54) PIEZOELECTRIC CERAMIC MATERIAL, ELECTRONIC PART USING THE CERAMIC

(75) Inventors: Masataka Kida, Omihachiman (JP); Masayoshi Katsube, Omihachiman (JP)

(73) Assignee: Murata Manufacturing Co. Ltd. (JP)

( * ) Notice: Subject to any disclaimer, the term of this patent is extended or adjusted under 35 U.S.C. 154(b) by 104 days.

(21) Appl. No.: 09/689,029

(22) Filed: Oct. 12, 2000

(30) Foreign Application Priority Data

Oct. 12, 1999 (JP) ............................................. 11-289901
Oct. 10, 2000 (JP) ........................................ 2000-309565

(51) Int. Cl.⁷ .................................................. B32B 9/00
(52) U.S. Cl. ...................... 428/699; 501/134; 428/697; 428/689; 252/69.9 R; 252/62.9 PZ
(58) Field of Search ................................. 428/697, 699, 428/688, 689; 252/62.9 R, 62.9 PZ; 501/134

(56) References Cited

FOREIGN PATENT DOCUMENTS

| EP | 0767152 A1 | 4/1997 | |
| JP | 11-026703 | * 1/1999 | ............ H01L/27/10 |

OTHER PUBLICATIONS

Patent Abstracts of Japan, vol. 017, No. 124 (C–1035), Mar. 16, 1993 & JP 04 305057 A (Aisin Seiki Co., Ltd.), Oct. 28, 1992; Abstract.

"Compositional Fluctuations and Properties of Fine–Grained Acceptor–Doped PZT Ceramics"; J.F. Fernandez, et al.; *Journal of the European Ceramic Society*; 18 (1998); pp. 1695–1705. No Month.

"Piezoelectricity and microstructures of modified lead titanate ceramics"; D.R. de Villiers, et al.; *Journal of Materials Science*; 25 (1990); pp. 3215–3220. No Month.

"Microstructural Evolution during Pressureless Sintering of Lead Lanthanum Zirconate Titanate Ceramics with Excess Lead(II) Oxide"; M.A. Akbas, et al.; *J. of Am. Ceram. Soc.*; 78(9) (1995); pp. 2417–2424. No Month.

* cited by examiner

Primary Examiner—Deborah Jones
Assistant Examiner—A B Sperty
(74) *Attorney, Agent, or Firm*—Dickstein, Shapiro, Morin & Oshinsky, LLP.

(57) ABSTRACT

A piezoelectric ceramic material having excellent mechanical strength, excellent resistance to chemicals, and excellent moisture resistance. The piezoelectric ceramic material contains lead oxide, wherein a closed region observed under a transmission electron microscope and defined by a plurality of crystal grains which constitute the sintered piezoelectric ceramic material and are adjacent to one another is predominantly formed of an amorphous phase.

12 Claims, 1 Drawing Sheet

//<br>
PIEZOELECTRIC CERAMIC MATERIAL, ELECTRONIC PART USING THE CERAMIC

BACKGROUND OF THE INVENTION

1. Field of the Invention

The present invention relates to a piezoelectric ceramic material and, more particularly, to a piezoelectric ceramic material having characteristic crystal grain conditions.

2. Background Art

Piezoelectric ceramics are widely used in piezoelectric devices such as resonators, filters, surface acoustic wave filters, IR sensors, ultrasound sensors, piezoelectric buzzers, and piezoelectric actuators. Such piezoelectric ceramics predominantly comprise lead titanate zirconate ceramic material. Typically, the piezoelectric ceramics are produced by mixing in predetermined compositional proportions lead oxide, titanium oxide, and zirconium oxide serving as predominant components; shaping to form a compact; and firing the compact.

Japanese Patent Application Laid-Open (kokai) Nos. 58-204579, 4-305057, and 5-114308 disclose, among such piezoelectric ceramics, some ceramics incorporating a glass component.

Specifically, Japanese Patent Application Laid-Open (kokai) No. 58-204579 discloses piezoelectric ceramics incorporating a silicate glass compound, a soda glass compound, or a lead compound in an amount of 1–30 wt. %.

Japanese Patent Application Laid-Open (kokai) No. 4-305057 discloses piezoelectric ceramics in which a glass component is crystallized to form a crystal grain boundary phase. Japanese Patent Application Laid-Open (kokai) No. 5-114308 discloses ceramics in which a ferroelectric ceramic is dispersed in a glass matrix.

However, such piezoelectric ceramics contain glass as a matrix component, and the glass is incorporated into a crystal grain boundary phase. Therefore, the ceramics have poor mechanical strength, poor resistance to chemicals such as acid and alkali, and poor moisture resistance, and reliability of the ceramics must be improved.

SUMMARY OF THE INVENTION

In view of the foregoing, the present inventors have conducted extensive studies, and have found that a piezoelectric ceramic material having specific grain boundary conditions solves the aforementioned drawbacks.

Accordingly, the present invention provides a piezoelectric ceramic material containing lead oxide, wherein a closed region observed under a transmission electron microscope and defined by a plurality of crystal grains which constitute the sintered piezoelectric ceramic material and are adjacent to one another (hereinafter simply referred to as a "closed region") predominantly comprises a glass phase including a network-forming oxide and no glass phase is observed at grain boundaries outside the closed region under a transmission electron microscope.

Preferably, in the piezoelectric ceramic material of the present invention, the total weight of the network-forming oxides relative to the total weight of the grains is about 100 to 700 ppm.

The present invention also provides an electronic part produced from the piezoelectric ceramic material.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with an accompanying drawing, in which.

DETAILED DESCRIPTION OF PREFERRED EMBODIMENTS

Figure 1:
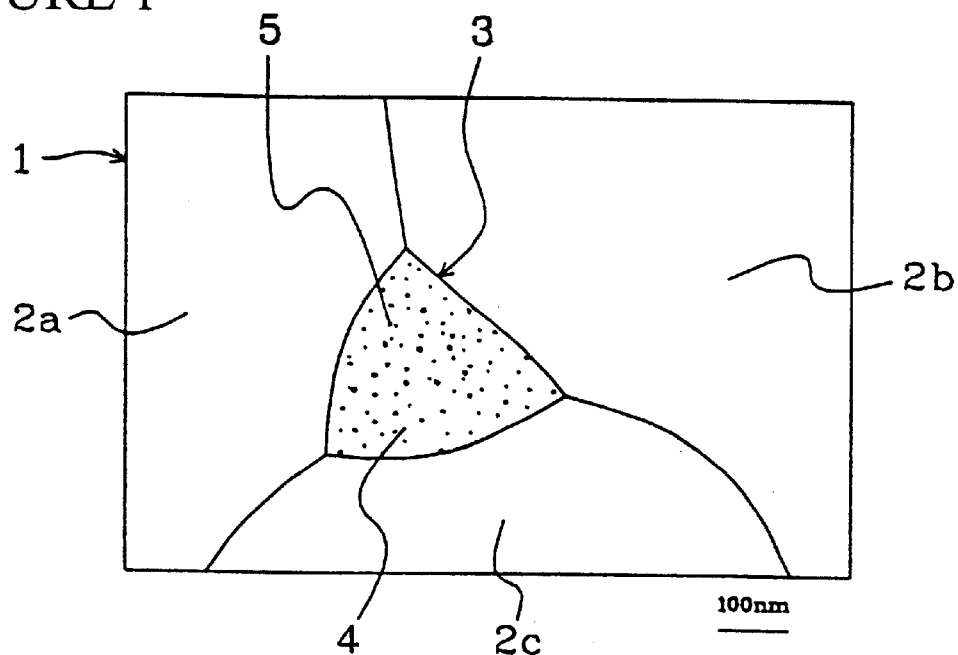
FIG. 1 is a schematic view obtained from a TEM (transmission electron microscopic) photographic image of a piezoelectric ceramic material according to the present invention.

In the aforementioned piezoelectric ceramic material, the glass phases contained in the closed regions are discrete; i.e., the respective glass phases are not in communication. In other words, a glass phase is observed only in the closed regions while no glass is observed in the other crystal grain boundaries. The existence of a glass phase can be observed by means of TEM.

The closed region predominantly comprises a glass phase which contains Pb oxide, Si oxide, and other oxides and may contain microcrystal grains. In some cases, the microcrystal grains contain Pb, Si, and Al. Pb contained in the closed region is assumed to be derived through segregation of a Pb-containing liquid component generated at grain boundaries during firing of a Pb-containing piezoelectric ceramic material and sintering. It can be considered that the surface tension of the liquid component causes the segregation at the closed region. Similarly, Si and Al are considered to be derived through segregation of Si and Al which are added to a ceramic raw material and migrate into the closed region during firing. Si oxide and Al oxide, e.g., $SiO_2$ and $Al_2O_3$, are network-forming oxides which can form glass. Preferable total amount of the network-forming oxides relative to the total amount of the grains of the ceramic is about 100–700 ppm because both of sufficient formation of glass phases at closed regions and sufficient growth of the ceramic grains can be realized and high mechanical strength, high resistance to chemicals such as acids or alkalis, high resistance to moisture and high stability of other characteristics can be achieved.

When the amount is less than 100 ppm, liquid of the network-forming oxides existing in the grain boundaries do not cause segregation at the closed region and the network-forming oxides remain at grain boundaries after firing and thus improvement of mechanical strength and the resistance to chemicals can not be achieved, whereas when the amount is in excess of 700 ppm, mechanical strength decreases to a level of a conventional piezoelectric ceramic material comprising a glass matrix. This is because the excess amount of the glass forming oxides causes the overflow of the segregated liquid component from the closed region into the boundaries between ceramic grains. The existence of glass-forming oxide at grain boundary result in a conventional piezoelectric ceramic which contains glass as a matrix component.

A variety of electronic parts are produced from the piezoelectric ceramic material. Examples of electronic parts produced from piezoelectric ceramics include resonators, filters, surface acoustic wave filters, IR sensors, ultrasound sensors, piezoelectric buzzers, and piezoelectric actuators. Such electronic parts comprise a piezoelectric ceramic body equipped with an electrode.

In the present invention, the term "piezoelectric ceramic material" refers to a piezoelectric ceramic material containing a lead oxide. Examples include lead titanate ceramic material, lead titanate zirconate ceramic material, lead metaniobate ceramic material, and lead-containing multi-component perovskite ceramic material.

The lead titanate ceramic materials include intrinsic and modified lead titanate ceramic materials. Examples of modified ceramics include lead titanate ceramic material to which transition metal oxide such as $Cr_2O_3$, $Nb_2O_5$, $Ta_2O_5$, $Bi_2O_3$, or $MnO_2$ is added; ceramic material of lead titanate in which Pb atoms are substituted by alkaline earth element (e.g., Mg, Ca, Sr, or Ba) oxide or rare earth element oxide such as $La_2O_3$, $Nd_2O_3$, or $Y_2O_3$; 2-component, 3-component, and multi-component ceramic material, or a combination thereof in which $PbTiO_3$ is partially substituted by at least one compound selected from multi-component perovskite compounds represented by the below-described formulas I to VI.

The lead titanate zirconate ceramic materials include intrinsic and modified lead titanate ceramic materials. Examples of modified ceramics include ceramic material of $Pb(Ti, Zr)O_3$ to which transition metal oxide such as $Cr_2O_3$, $Nb_2O_5$, $Ta_2O_5$, $Bi_2O_3$, or $MnO_2$ has been added; ceramic material of lead titanate zirconate in which Pb atoms are substituted by an oxide of an alkaline earth element (e.g., Mg, Ca, Sr, or Ba) or a rare earth element oxide such as $La_2O_3$, $Nd_2O_3$, or $Y_2O_3$; 2-component, 3-component, and multi-component ceramic material, or a combination thereof in which $Pb(Ti, Zr)O_3$ is partially substituted by at least one compound selected from multi-component perovskite compounds represented by the below-described formula I to VI.

The lead metaniobate ceramic materials include intrinsic and modified lead titanate ceramic materials. Examples of modified ceramics include ceramic material of simple lead metaniobate to which transition metal oxide such as $Cr_2O_3$, $Nb_2O_5$, $Ta_2O_5$, $Bi_2O_3$, or $MnO_2$ has been added; ceramic material of lead metaniobate in which Pb atoms are substituted by an oxide of an alkaline earth element (e.g., Mg, Ca, Sr, or Ba) or a rare earth element oxide such as $La_2O_3$, $Nd_2O_3$, or $Y_2O_3$; 2-component, 3-component, and multi-component ceramic material, or a combination thereof in which lead metaniobate is partially substituted by at least one compound selected from multi-component perovskite compounds represented by the below-described formula I to VI.

The lead-containing multi-component perovskite ceramic materials include Pb-containing multi-component perovskite compounds represented by the below-described formula I to VI and 2-component, 3-component, and multi-component ceramic material, or a combination thereof comprising at least one of the aforementioned Pb-containing multi-component perovskite compounds and another multi-component perovskite compound. Specific examples include single-component ceramics such as $Pb(Fe_{2/3}W_{1/3})O_3$ and $Pb(Fe_{1/2}Nb_{1/2})O_3$; 2-component ceramics such as and $Pb(Fe_{1/2}Nb_{1/2})O_3$—$Pb(Fe_{2/3}W_{1/3})O_3$; and 3-component ceramics such as $Pb(Mn_{1/3}Nb_{1/2})O_3$—$Pb(Fe_{1/2}Nb_{1/2})O_3$—$Pb(Fe_{2/3}W_{1/3})O_3$—$Pb(Fe_{1/2}Nb_{1/2})O_3$—$Pb(Fe_{2/3}W_{1/3})O_3$.

Typical examples of the aforementioned multi-component perovskite compounds include:

compounds represented by formula (I): $A^{2+}(B_{1/3}^{2+}B_{2/3}^{5+})O_3$, such as $Ba(Zn_{1/3}Nb_{2/3})O_3$, $Ba(Cd_{1/3}Nb_{2/3})O_3$, $Ba(Mg_{1/3}Nb_{2/3})O_3$, $Sr(Cd_{1/3}Nb_{2/3})O_3$, $Pb(Mg_{1/3}Nb_{2/3})O_3$, $Pb(Ni_{1/3}Nb_{2/3})O_3$, $Pb(Mg_{1/3}Ta_{2/3})O_3$, $Pb(Zn_{1/3}Nb_{2/3})O_3$, $Pb(Co_{1/3}Nb_{2/3})O_3$, $Pb(Co_{1/3}Ta_{2/3})O_3$, $Pb(Ni_{1/3}Ta_{2/3})O_3$, and $Pb(Cd_{1/3}Nb_{2/3})O_3$;

compounds represented by formula (II): $A^{2+}(B_{1/2}^{3+}B_{1/2}^{5+})O_3$, such as $Ba(Fe_{1/2}Nb_{1/2})O_3$, $Ba(Sc_{1/2}Nb_{1/2})O_3$, $Ca(Cr_{1/2}Nb_{1/2})O_3$, $Pb(Fe_{1/2}Nb_{1/2})O_3$, $Pb(Fe_{1/2}Ta_{1/2})O_3$, $Pb(Sc_{1/2}Nb_{1/2})O_3$, $Pb(Sc_{1/2}Ta_{1/2})O_3$, $Pb(Yb_{1/2}Nb_{1/2})O_3$, $Pb(Yb_{1/2}Ta_{1/2})O_3$, $Pb(Lu_{1/2}Nb_{1/2})O_3$, and $Pb(In_{1/2}Nb_{1/2})O_3$;

compounds represented by formula (III): $A^{2+}(B_{1/2}^{2+}B_{1/2}^{6+})O_3$, such as $Pb(Cd_{1/2}W_{1/2})O_3$, $Pb(Mn_{1/2}W_{1/2})O_3$, $Pb(Zn_{1/2}W_{1/2})O_3$, $Pb(Mg_{1/2}W_{1/2})O_3$, $Pb(Co_{1/2}W_{1/2})O_3$, $Pb(Ni_{1/2}W_{1/2})O_3$, $Pb(Mg_{1/2}Te_{1/2})O_3$, $Pb(Mn_{1/2}Te_{1/2})O_3$, and $Pb(Co_{1/2}Te_{1/2})O_3$;

compounds represented by formula (IV): $A^{2+}(B_{2/3}^{3+}B_{1/3}^{6+})O_3$, such as $Pb(Fe_{2/3}W_{1/3})O_3$;

compounds represented by formula (V): $A^{3+}(B_{1/2}^{2+}B_{1/2}^{4+})O_3$, such as $La(Mg_{1/2}Ti_{1/2})O_3$ and $Nd(Mg_{1/2}Ti_{1/2})O_3$; and compounds represented by formula (VI): $(A_{1/2}^{1+}A_{1/2}^{3+})BO_3$, such as $(Na_{1/2}La_{1/2})TiO_3$ and $(K_{1/2}La_{1/2})TiO_3$.

The ceramic material of the present invention contains a closed region defined by oxide crystal grains constituting the ceramic material. Such crystal grain arrangement can be attained by optimizing, among others, compositional proportions of raw material, the particle size of raw material, $SiO_2$ content and $Al_2O_3$ content in raw material, and firing conditions. Specifically, the optimization of the amount of $SiO_2$ and $Al_2O_3$ in a sinterable raw material is the most effective.

EXAMPLES

The present invention will next be described in detail by way of examples, which should not be construed as limiting the invention thereto.

FIG. 1 shows a part of a sintered piezoelectric ceramic body 1 which includes a lead oxide. Crystal grains 2a, 2b and 2c were observed. A closed region 3 surrounded by the crystal grains 2a, 2b and 2c were also observed. The crystal grains were filled by glass phase 4. The glass phase contained fine grains 5 having smaller diameter than the crystal grains and were distributed in the closed region.

Figure 2:
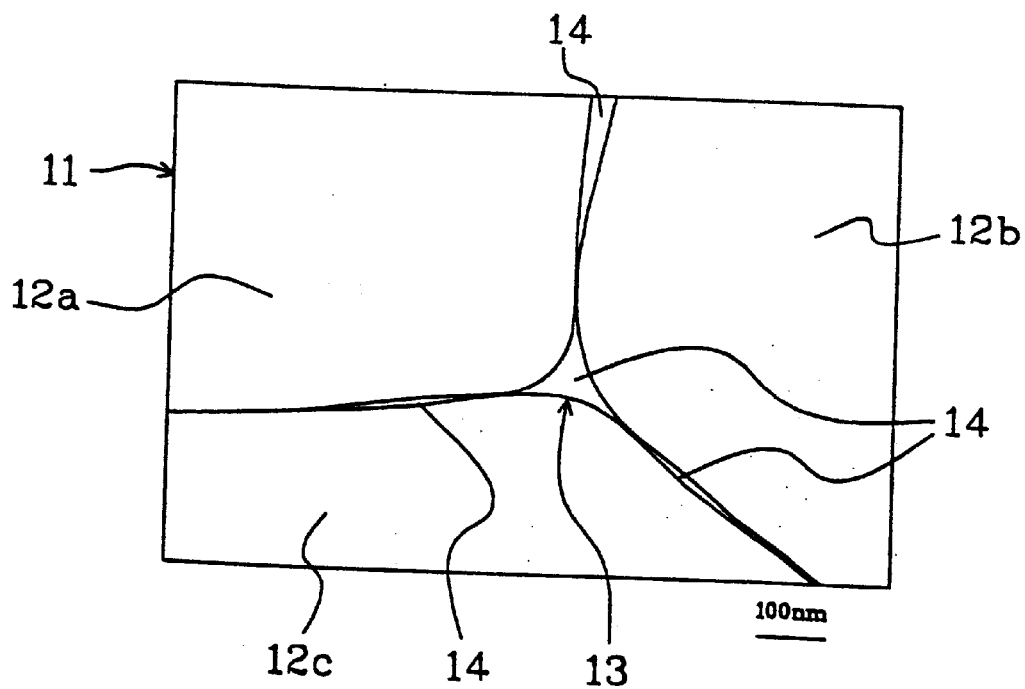
FIG. 2 is a schematic view obtained from a TEM (transmission electron microscopic) photographic image of a comparison piezoelectric ceramic material.

FIG. 2 shows a schematic diagram of TEM picture in accordance with a comparison sample in which small amount of a network-forming oxide less than 100 ppm was added.

Glass phases were observed in the grain boundaries between the grains 12a and 12c, between the grains 12a and 12b and between the grains 12b and 12c respectively. Glass phase 14 were also observed in a closed region 13.

Example 1

PbO, $TiO_2$, $ZrO_2$, $MnCO_3$, $Nb_2O_5$, $Cr_2O_3$, $SiO_2$, and $Al_2O_3$ serving as raw materials were weighed such that a piezoelectric ceramic comprising $Pb(Mn_{1/3}Nb_{2/3})_{0.10}(Zr_{0.40}Ti_{0.50})_{0.90}O_3$ serving as a predominant component and $Cr_2O_3$ (0.10 wt. %) serving as an additive component could be produced. The total amount of network-forming oxides, such as $SiO_2$ and $Al_2O_3$, incorporated into the piezoelectric ceramic was varied in accordance with samples, as shown in Table 1. Each weighed raw material was mixed under wet conditions for 16–20 hours. The resultant mixture was dehydrated, dried, and calcined at 930° C. for two hours. The calcined product was crushed and blended with a binder containing polyvinyl alcohol and polyethylene glycol. The mixture was granulated by spraying and dried. The thus-prepared granular material was press-formed, to thereby prepare a compact. The compact was fired at a maximum temperature of 1150° C., to thereby prepare a piezoelectric ceramic sheet sample having dimensions of 5 mm×30 mm×0.3 mm.

The existence of glass phase at grain boundaries, mechanical strength and resistance to chemical and resistance to moisture of the thus-prepared sample was measured.

The existence of glass phase at grain boundaries was observed as follows.

First, a sample piezoelectric ceramic was mechanically polished to prepare a disk having 20 μm thickness. The thin disk was further applied to Argon atom beam to obtain thinner disk. The disk was applied to TEM (model JEM-2010, by JEOL Ltd.). Most of closed regions have triangular shape formed by grain boundaries of three ceramic grains on a picture obtained by TEM analysis. The existence of glass phase is determined by an analysis of the picture by the naked eye.

Mechanical strength of the sample was measured as follows.

The sample was placed on two beams located 15 mm apart, and a load was applied to the center of the sample, to thereby carry out a 3-point bending test.

Resistance to chemicals was measured as follows.

The sample was immersed in an alkaline solution (pH: 11.5) for 30 minutes. After the sample was washed, bending strength was measured.

Moisture resistance was measured as follows.

The sample was allowed to stand in an atmosphere of 95% relative humidity for 1000 hours. The difference in mechanical quality factor before and after the test was divided by initial mechanical quality factor, thereby obtaining moisture resistance (change ratio).

The results of the measurements are shown in Table 1.

The results of observation by use of a TEM show that the closed region assumes a generally triangular shape having a length of one side of approximately 400–500 nm, and is filled with a unique phase. The phase is confirmed to comprise network-forming oxides and microcrystal grains. As is clear from elemental analysis, the network-forming phase contains Pb and Si and the microcrystal grains contain Pb and Si.

TABLE 1

| Sample No. | Total amount of network-forming oxides (ppm) | Bending strength (Kgf/cm$^2$) | Resistance to chemicals (%) | Moisture resistance (%) | Glass phase at grain boundary |
|---|---|---|---|---|---|
| *1 | 20 | 1002 | −28 | −53 | Observed |
| *2 | 50 | 1150 | −10 | −30 | Observed |
| 3 | 100 | 1473 | −3 | −8 | Not observed |
| 4 | 150 | 1650 | −1 | −1 | Not observed |
| 5 | 200 | 1751 | −1 | 0 | Not observed |
| 6 | 250 | 1723 | −3 | −1 | Not observed |
| 7 | 300 | 1799 | −1 | −2 | Not observed |
| 8 | 500 | 1715 | −4 | −4 | Not observed |
| 9 | 700 | 1524 | −7 | −11 | Not observed |
| *10 | 800 | 1401 | −10 | −13 | Observed |
| *11 | 1000 | 1266 | −11 | −13 | Observed |
| *12 | 1200 | 1150 | −19 | −45 | Observed |

As shown in Table 1, the samples 1 and 2 do not form closed regions sufficiently and have poor mechanical strength, poor resistance to chemicals, and poor moisture resistance. The samples 10, 11 and 12 form closed region filled with network-forming oxides, but the oxides communicates with another glass phase contained in an interface between crystal grains. Thus, the sample has poor mechanical strength, poor resistance to chemicals, and poor moisture resistance. Examples 2 to 8

PbO, $TiO_2$, $ZrO_2$, $MnCO_3$, $Nb_2O_5$, NiO, $Co_2O_3$, $SnO_2$, $Sb_2O_3$, MgO, $SiO_2$, and $Al_2O_3$ serving as raw materials were weighed such that piezoelectric ceramics comprising $Pb(Ni_{1/3}Nb_{2/3})_{0.10}(Zr_{0.40}Ti_{0.50})_{0.90}O_3$ (Example 2), $Pb(Co_{1/3}Nb_{2/3})_{0.10}(Zr_{0.40}Ti_{0.50})_{0.90}O_3$ (Example 3), $Pb(Sn_{1/2}Sb_{1/2})_{0.10}(Zr_{0.40}Ti_{0.50})_{0.90}O_3$ (Example 4), $Pb(Mn_{1/3}Nb_{1/3}Sb_{1/3})_{0.10}(Zr_{0.40}Ti_{0.50})_{0.90}O_3$ (Example 5), $Pb(Mg_{1/3}Nb_{2/3})_{0.10}(Zr_{0.40}Ti_{0.50})_{0.90}O_3$ (Example 6), and $PbTiO_3$ (Example 7) could be produced. The total amount of network-forming oxides such as $SiO_2$ and $Al_2O_3$ incorporated into the piezoelectric ceramics is shown in Table 2. Each weighed raw material was mixed under wet conditions for 16–20 hours. The resultant mixture was dehydrated, dried, and calcined at the temperature shown in Table 2 for two hours. The calcined product was crushed and blended with a binder containing polyvinyl alcohol and polyethylene glycol. The mixture was granulated by spraying and dried. The thus-prepared granular material was press-formed, to thereby prepare a compact. The compact was fired at the maximum temperature shown in Table 2, to thereby prepare a piezoelectric ceramic sheet sample having dimensions of 5 mm×30 mm×0.3 mm.

The mechanical strength, resistance to chemicals, and moisture resistance of the thus-prepared sample were investigated in a manner similar to that of Example 1. The results are shown in Table 2.

TABLE 2

| Sample No. | Total amount of network-forming oxides (ppm) | Calcining temp. (° C.) | Firing temp. (° C.) | Mechanical strength (Kgf/cm$^2$) | Resistance to chemicals (%) | Moisture resistance (%) | Glass phase at grain boundary |
|---|---|---|---|---|---|---|---|
| 2 | 230 | 970 | 1210 | 1463 | −3 | −5 | No |
| 3 | 190 | 950 | 1170 | 1444 | −5 | −8 | No |
| 4 | 630 | 810 | 1100 | 1559 | −1 | −6 | No |
| 5 | 460 | 1000 | 1280 | 1695 | −1 | 0 | No |
| 6 | 400 | 840 | 1210 | 1396 | −8 | −8 | No |
| 7 | 320 | 850 | 1230 | 2039 | 0 | 0 | No |

Each piezoelectric ceramic sample was observed under a transmission electron microscope (TEM) in a manner similar to that of Example 1 so as to investigate a closed region defined by crystal grains adjacent to one another.

From the results of observation by use of a TEM, the closed region assumes a generally triangular shape, and is filled with a unique phase. The phase is confirmed to comprise network-forming oxides and microcrystal grains. As is clear from elemental analysis, the oxides contain Pb and Si and the microcrystal grains contain Pb, Si, and $Al_2O_3$. As is clear from the results, formation of crystal grains and the closed region is ensured, thereby improving mechanical strength, resistance to chemicals such as acid and alkali, moisture resistance, and reliability of the produced piezoelectric ceramic material.

A driving electrode and a sensing electrode are formed on the piezoelectric ceramic body according to the present invention, to thereby produce piezoelectric devices such as resonators, filters, surface acoustic wave filters, IR sensors, ultrasound sensors, piezoelectric buzzers, and piezoelectric actuators.

As described hereinabove, the piezoelectric ceramic material of the present invention has high mechanical strength, excellent resistance to chemicals, and excellent moisture resistance.

The electronic parts which are produced from the piezoelectric ceramic material exhibit improved mechanical strength, resistance to chemicals, and moisture resistance. Thus, the electronic parts of the invention have resistance to deterioration in characteristics.

What is claimed is:

1. A lead oxide-containing piezoelectric ceramic material, having a closed region observed under a transmission electron microscope and defined by a plurality of crystal grains which are adjacent to one another and constituting the sintered piezoelectric ceramic material, which region comprises a glass phase including a network-forming oxide, and wherein said glass phase is not observed at grain boundaries other than said closed region under the transmission electron microscope.

2. A piezoelectric ceramic material according to claim 1, wherein the total weight of said network-forming oxides relative to the total weight of said grains is about 100 to 700 ppm.

3. A piezoelectric ceramic material according to claim 2, wherein the piezoelectric ceramic material comprises a lead titanate ceramic material.

4. A piezoelectric ceramic material according to claim 2, wherein the piezoelectric ceramic material comprises a lead titanate zirconate ceramic material.

5. A piezoelectric ceramic material according to claim 2, wherein the piezoelectric ceramic material comprises a lead metaniobate ceramic material.

6. A piezoelectric ceramic material according to claim 2, wherein the piezoelectric ceramic material comprises a lead-containing multi-component perovskite ceramic material.

7. A piezoelectric ceramic material comprising:

a piezoelectric ceramic comprising said piezoelectric ceramic according to claim 6; and an electrode in contact with said piezoelectric ceramic.

8. A piezoelectric ceramic material comprising:

a piezoelectric ceramic comprising said piezoelectric ceramic according to claim 5; and an electrode in contact with said piezoelectric ceramic.

9. A piezoelectric ceramic material comprising:

a piezoelectric ceramic comprising said piezoelectric ceramic according to claim 4; and an electrode in contact with said piezoelectric ceramic.

10. A piezoelectric ceramic material comprising:

a piezoelectric ceramic comprising said piezoelectric ceramic according to claim 3; and an electrode in contact with said piezoelectric ceramic.

11. A piezoelectric ceramic material comprising:

a piezoelectric ceramic comprising said piezoelectric ceramic according to claim 2; and an electrode in contact with said piezoelectric ceramic.

12. A piezoelectric ceramic material comprising:

a piezoelectric ceramic comprising said piezoelectric ceramic according to claim 1; and an electrode in contact with said piezoelectric ceramic.

* * * * *